United States Patent [19]
Yamasaki et al.

[11] Patent Number: 5,554,885
[45] Date of Patent: Sep. 10, 1996

[54] SEMICONDUCTOR DEVICE INCLUDING MEANS FOR DISPERSING AND ABSORBING TENSILE FORCES ACTING ON FILM TAPE

[75] Inventors: Yasuo Yamasaki; Norikata Hama; Munenori Kurasawa; Nobuaki Hashimoto, all of Suwa, Japan

[73] Assignee: Seiko Epson Corporation, Tokyo, Japan

[21] Appl. No.: 253,878

[22] Filed: Jun. 3, 1994

[30] Foreign Application Priority Data

| Jun. 4, 1993 | [JP] | Japan | 5-134738 |
|---|---|---|---|
| Jun. 4, 1993 | [JP] | Japan | 5-134739 |
| Jun. 4, 1993 | [JP] | Japan | 5-134740 |
| May 17, 1994 | [JP] | Japan | 6-126912 |

[51] Int. Cl.⁶ .................. H01L 23/495; H01L 23/498
[52] U.S. Cl. .................. 257/666; 257/669; 257/675; 257/676; 257/668
[58] Field of Search .................. 257/666, 668, 257/669, 670, 673, 787, 788, 790, 674, 675, 676

[56] References Cited

U.S. PATENT DOCUMENTS

| 4,809,053 | 2/1989 | Kuraisji | 257/668 |
|---|---|---|---|
| 5,126,824 | 6/1992 | Veda | 257/702 |
| 5,157,478 | 10/1992 | Veda et al. | 257/796 |
| 5,196,917 | 3/1993 | Veda et al. | 257/666 |
| 5,349,238 | 9/1994 | Ohsawa et al. | 257/673 |

FOREIGN PATENT DOCUMENTS

| 0063451 | 2/1992 | Japan | 257/668 |
|---|---|---|---|
| 0124846 | 4/1992 | Japan | . |
| 0369234 | 12/1992 | Japan | 257/668 |
| 0037141 | 2/1994 | Japan | 257/668 |

*Primary Examiner*—Peter Toby Brown
*Attorney, Agent, or Firm*—Harold T. Tsiang

[57] ABSTRACT

A semiconductor device comprises an electrically insulating film having a device hole; a plurality of groups of leads, each group including of a large number of leads arranged in a predetermined pattern, in a plurality of lead formation regions on the surface of the film; an integrated circuit chip positioned within the device hole and with electrodes connected to inner lead portions of the leads; and a resin sealing portion that seals in at least the integrated circuit chip, the film, and the lead groups. The film comprises a first group of aperture portions including of aperture portions provided in regions outside the lead formation regions and a second group of aperture portions consisting of a plurality of aperture portions provided in the lead formation regions.

15 Claims, 7 Drawing Sheets

SEMICONDUCTOR DEVICE INCLUDING MEANS FOR DISPERSING AND ABSORBING TENSILE FORCES ACTING ON FILM TAPE

BACKGROUND OF THE INVENTION

This invention relates to a resin-sealed type of semiconductor device that is manufactured by using a tape carrier technique called tape automated bonding (TAB) or tape carrier package (TCP), and a method of manufacturing such a semiconductor device.

One example of this type of semiconductor device is produced by the technique disclosed in Japanese Patent Application Laid-Open No. Hei 4-124846. With this technique, two different types of die-cut portions 1 and 3 as well as a single aperture portion 5 are formed in a film tape 2, as shown in FIG. 15. Four lead groups 4a to 4d, each comprising a large number of leads 4, and an integrated circuit chip 6 that is connected to these leads 4 are also formed in every one frame of film tape 2. A characteristic of this technique is the way in which the aperture portion 5 is formed between lead group 4a and lead group 4d, within a resin sealing region, so that molten resin can move through this aperture portion 5 during the resin sealing process.

The die-cut portions 1 are also formed within the resin sealing region in which lead groups 4a to 4d are arranged, separate from this aperture portion 5. The configuration is such that the molten resin can also move through these die-cut portions 1 during the resin sealing. Note that the die-cut portions indicated by reference number 3 in FIG. 15 are outer lead holes that act as aperture portions for punching the semiconductor device out after the resin sealing has been completed.

In accordance with this configuration, when the integrated circuit chip is being resin-sealed by a method such as transfer molding, the molten resin will mainly flow through the aperture portion 5 from the side that has the larger rate of flow to the side that has the smaller one, even if the rates of flow of resin into the resin injection chambers of the upper and lower dies are different, so the rates of flow of the resin in the upper and lower resin injection chambers can be kept balanced.

However, such a semiconductor device has a problem in that, since die-cut portions 1 are formed to extend along a wide range along the edges of the film, a tensile force F acting on the film tape during its transportation, for example, could easily cause the film tape to deform as shown by broken lines in FIG. 16. This deformation could cause leads 4 formed on the film tape to break.

SUMMARY OF THE INVENTION

The present invention is designed to solve the above problem and provides a semiconductor device that can suppress deformation of the film caused by resin pressure in a transfer molding step, and thus prevent peeling of a resin sealing portion. It also provides a method of manufacturing such a semiconductor device.

The semiconductor device of this invention comprises: an electrically insulating film having a device hole; a plurality of groups of leads, each group including a number of leads, arranged in a predetermined pattern in a plurality of lead formation regions on the surface of the film; an integrated circuit chip which is arranged within the device hole of the film and which has electrodes connected to ends of the leads; and a resin sealing portion that seals in at least the integrated circuit chip, the film, and the groups of leads. The film comprises: a first group of aperture portions which includes at least one aperture portion and which is provided within a region other than the lead formation regions, and a second group of aperture portions which includes a plurality of aperture portions and which is provided within the lead formation regions. In this semiconductor device, each of the leads comprises an inner lead portion protruding into the device hole and an outer lead linkage portion extending outward beyond the film. It is preferable that this outer lead linkage portion is connected to an outer lead that has a mechanical strength greater than that of the outer lead linkage portion.

With this semiconductor device, since a first group of aperture portions having at least one aperture portion is provided in a region in which no leads are formed, and also a second group of aperture portions is formed in the lead formation regions, molten resin can flow through these aperture portions during a molding step such as during transfer molding. As a result, the resin can seal the two sides of the film, the joint between the resin sealing portion and the object that is sealed such as the film, can be made secure, and peeling of the resin sealing portion is prevented. Further, since the second group of aperture portions includes a plurality of separated aperture portions, sufficient mechanical strength is ensured, and thus deformation of the film due to the action of tensile forces while the film is being transported, for example, is suppressed. As a result, breaking and short-circuiting of the leads caused by deformation of the film are prevented.

With this semiconductor device, there are long, narrow linking portions between mutually adjacent aperture portions forming the second group of aperture portions, and the longitudinal directions of these long, narrow linking portions are preferably orientated so as to intersect the edges of the film. Forming the long, narrow linking portions in directions that intersect the edges of the film ensures that, if tensile forces should act on the film, for example, those tensile forces are dispersed and absorbed by the long, narrow linking portions, and thus deformation of the film is effectively controlled.

The long, narrow linking portions are also preferably orientated such that their longitudinal directions are perpendicular to the leads. Providing the long, narrow linking portions orientated perpendicular to the leads ensures that the film can be provided with sufficient mechanical strength with respect to the tensile forces acting in the axial direction of the leads. Providing the long, narrow linking portions orientated perpendicular to the leads also allows the leads to be shorter at the second group of aperture portions, so that occurrence of short circuits or breakages of the leads can be reduced.

To ensure that the plurality of aperture portions forming the second group of aperture portions absorb the tensile forces acting on the film as uniformly as possible, they are preferably arranged symmetrically along the edges of the film.

The aperture portions forming the second group of aperture portions are also preferably formed at positions separated from bent portions of the leads. This is because, if aperture portions were to be positioned at such bent portions, the mechanical strength of the bent portions would be less than that of the other, straight portions, making the leads readily deformable.

In this semiconductor device, side leads positioned at the outermost sides of the leads forming the lead groups are preferably and have a greater mechanical strength than the other leads. Making the side leads thicker than the other leads prevents problems such as the possibility of erroneous recognition during the image recognition used in the positioning of the film and lead frame. This also increases the mechanical strength of the side leads, making it possible to obtain sufficient resistance to, for example, resin pressure during molding.

In this semiconductor device, the integrated circuit chip is preferably positioned at substantially the center in the depthwise direction within the resin sealing portion. Positioning the integrated circuit chip, which has the largest volume among components constituting the semiconductor device, at substantially the center of the resin sealing portion ensures that the volumes of the upper and lower cavities separated by the IC chip to be sealed can be made substantially equal during the transfer molding, for example. This means that the excess pressure that would be applied to the IC chip by the flow of the molten resin in the vertical direction can be suppressed if the volumes of the upper and lower cavities were different. As a result, deformation of the film or leads and displacement of the IC chip can be prevented.

In this semiconductor device, it is preferable to form a resin layer composed of a resin having good adhesive properties with respect to the leads and the resin forming the resin sealing portion, in a region encompassing the inner lead portions of the leads and the electrodes of the integrated circuit chip. The provision of an additional resin layer ensures that the portions surrounding the electrodes of the integrated circuit chip can be protected by a resin with good adhesive properties, and thus the occurrence of peeling or cracking of the sealing portion can be prevented.

In this semiconductor device, a radiator portion is preferably attached to the integrated circuit chip, so that heat from the integrated circuit chip is radiated to the outside by this radiator portion.

A method of manufacturing a semiconductor device in accordance with this invention comprises the steps of:

(a) forming, in an electrically insulating film having a plurality of lead formation regions, at least a device hole, a first group of aperture portions each in a region between two lead formation regions, and a second group of aperture portions including a plurality of aperture portions within said lead formation regions;

(b) attaching a conductive film to said insulating film, using photolithography and etching to form leads within said lead formation regions of said insulating film, so that each lead comprises an inner lead portion extending into said device hole and an outer lead linkage portion;

(c) placing an integrated circuit chip within said device hole and connecting electrodes of said integrated circuit chip to said inner lead portions of said leads;

(d) superimposing on a predetermined position of said insulating film a lead frame having outer leads arranged at the same pitch as said outer lead linkage portions and having a mechanical strength greater than that of said outer lead linkage portions, and connecting said outer lead linkage portions to said outer leads; and (e) using transfer molding to form resin sealing portion to seal said integrated circuit chip, said leads, and part of said outer leads in resin.

This manufacturing method ensures that the semiconductor device of this invention can be manufactured efficiently and with a high yield.

Thus, by providing the film with a first group of aperture portions including at least one aperture portion within a region outside the lead formation regions and a second group of aperture portions including a plurality of aperture portions within the lead formation regions, the present invention provides a semiconductor device in which deformation of the film caused by resin pressure during the transfer molding stop can be suppressed, and peeling of the resin sealing portion can be prevented. It also provides a method of manufacturing such a semiconductor device, Other objects and attainments together with a fuller understanding of the invention will become apparent and appreciated by referring to the following description and claims taken in conjunction with the accompanying drawings.

DESCRIPTION OF THE PREFERRED EMBODIMENTS

First Embodiment

Figure 1:
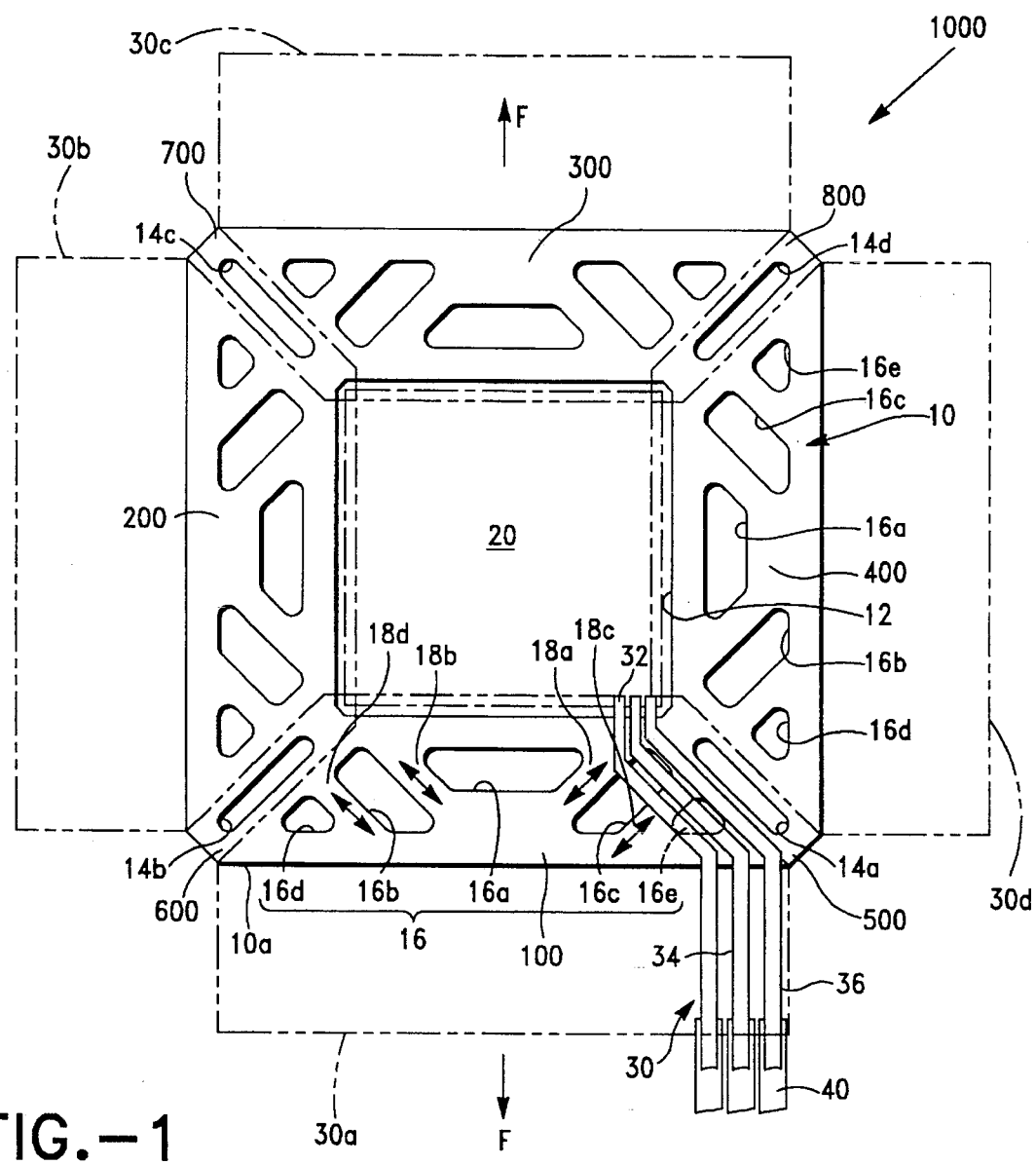
FIG. 1 is a plan view showing essential components of a semiconductor device of a first embodiment of this invention.
Figure 3:
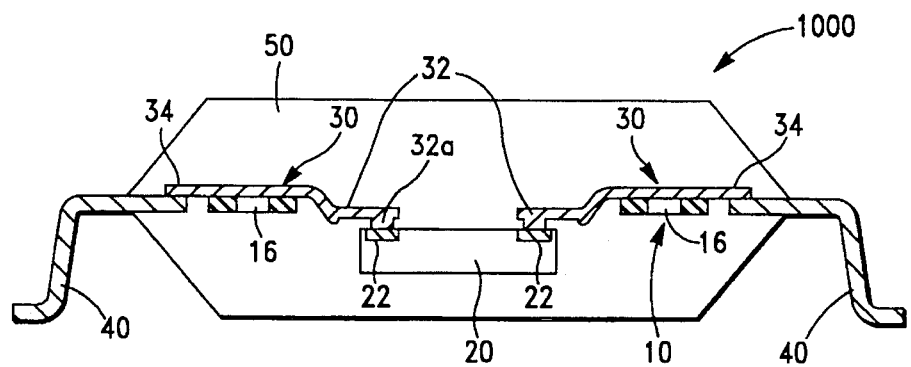
FIG. 3 is a vertical cross sectional view of the semiconductor device of the first embodiment.
Figure 2:
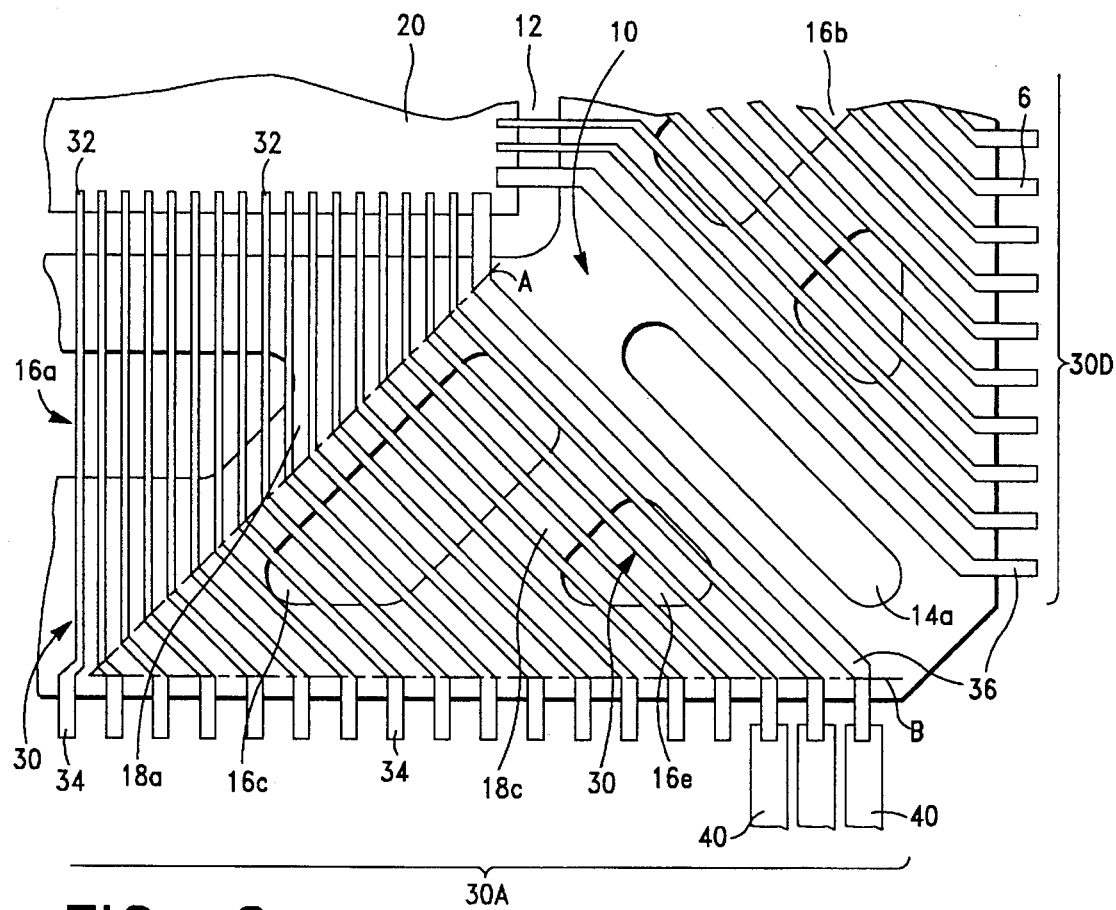
FIG. 2 is an enlarged plan view of part of the semiconductor device of FIG. 1.

FIG. 1 is a plan view showing the essential components of a semiconductor device 1000 of the first embodiment of this invention. A partial enlarged plan view of a part (a corner portion) of FIG. 1 is shown in FIG. 2. A cross sectional view taken vertically through substantially the center of semiconductor device 1000 is shown in FIG. 3.

Semiconductor device 1000 of this embodiment comprises an electrically insulating film 10, a plurality of lead groups 30A to 30D formed on one surface of film 10, an integrated circuit chip (IC chip) 20, and a resin sealing portion 50.

A device hole 12 for mounting IC chip 20 is formed at the center of the film 10. Lead formation regions 100 to 400 are formed on the surface of the film 10 as four regions separated along lines that cut substantially diagonally across the film 10. Each of these lead formation regions 100 to 400 is separated from its neighboring regions by a predetermined spacing, and regions 500 to 800 in which no leads are formed are provided therebetween.

Slit-shaped first aperture portions 14a to 14d are formed along the diagonals of film 10, in the respective regions 500 to 800 in which no leads are formed. These first aperture portions 14 (14a to 14d) are preferably formed to be as large as possible, without adversely affecting the mechanical strength of film 10, to make it easy for the molten resin to flow therethrough during the transfer molding.

Lead groups 30A to 30D, each including a large number of leads 30, are arranged in a predetermined pattern on film 10 in the respective lead formation regions 100 to 400. Each of leads 30 has an inner lead portion (finger) 32 that protrudes toward device hole 12 and an outer lead linkage portion 34 that protrudes outward from edge 10a of film 10. Each inner lead portion 32 is connected to an electrode 22 of IC chip 20 that is arranged within device hole 12, whereas each outer lead linkage portion 34 is connected to an outer lead 40. Inner lead portion 32 has a protrusion (bump) 32a at the tip thereof, and this protrusion 32a is connected to electrode 22. This connection method is called the mesa bump method (the photo-engraved bump method) and will be described in more detail later.

Leads 30 forming lead groups 30A to 30D are bent where they cross lines that are indicated by reference letters A and B in FIG. 2, in an arrangement such that the lead pitch on the outer lead linkage portion 34 side is greater than the lead pitch on the inner lead portion 32 side. For example, the lead pitch on the inner lead portion 32 side could be set to between 40 µm and 200 µm, with that on the outer lead linkage portion 34 side being set to between 100 µm and 500 µm.

In this embodiment, a side lead 36 that is positioned at each outermost side of each of lead groups 30A to 30D has a width greater than that of other leads 30. More specifically, side leads 36 preferably have a width that is of the order of 1.5 to 3 times that of the other leads. For example, if the width of other leads 30 is between 80 and 100 µm, that of side leads 36 is set to be between 160 and 200 µm.

Making side leads 36 at each side of lead groups 30A to 30D wider in this manner ensures that there will be no problems such as erroneous recognition in the image recognition performed during the positioning of the film and the lead frame. Making the width of side leads 36 larger also increases their mechanical strength, ensuring that they have sufficient resistance to forces such as resin pressure during molding. When such densely packed leads are formed, it is usually necessary to make their width smaller so that their mechanical strength is less, and thus these leads, particularly the side leads positioned at the outermost ends, are subjected to stresses and can easily break.

The material of film 10 is not particularly limited, but it is preferable that, in addition to an electrical insulating property, it can resist heat. For example, polyimide resin, polyetherimide resin, polyester resin, or epoxy resin with glass fibers may be used. Polyimide resin is particularly preferable. Such ceramic materials as alumina, aluminum nitride, and silicon carbide, which has good mechanical strength and heat conductivity, can also be used as the material of the film 10.

A second group of aperture portions 16 including a plurality of aperture portions 16a to 16e is formed in each of lead formation regions 100 to 400. These aperture portions 16a to 16e are arranged symmetrically along the edges (10a) of film 10. Each of aperture portions 16a to 16e is also formed so that the edges of adjacent aperture portions are substantially parallel, and thus linking portions 18a to 18d are formed between adjacent aperture portions 16a to 16e. These linking portions 18 (18a to 18d) are formed in directions that intersect edges 10a of film 10. In this embodiment, the direction of linking portions 18a and 18c on the right side with respect to edge 10a is opposite to that of linking portions 18b and 18d on the left side, and all of them are formed at approximately 45 degrees relative to the axis intersecting edge 10a.

Forming linking portions 18 in directions that intersect edges 10a of film 10 ensures that, if tensile forces (indicated by F in FIG. 1) should act in film 10, stresses generated by these tensile forces F will be along linking portions 18, and thus tensile forces F will be dispersed and absorbed. As a result, the amount by which the film is displaced in the direction of pull can be reduced, with the effect that deformation of film 10 is suppressed.

Linking portions 18 are also preferably formed in directions that are perpendicular to leads 30. More specifically, as shown in FIG. 2, since linking portion 18 (18c) is provided in a direction that is perpendicular to leads 30, sufficient mechanical strength with respect to the tensile forces acting in the axial direction of leads 30 can be ensured for film 10. Further, it is preferable that no aperture portions are positioned at the bend portions (portions indicated by A and B in FIG. 2) of leads 30. This is because, if aperture portions were to be positioned at these bend portions, the mechanical strength of the bend portions would be less than that of the other, straight portions, making the leads readily deformable.

In this manner, by arranging the second group of aperture portions 16 including a plurality of aperture portions 16a to 16e in each of lead formation regions 100 to 400, this embodiment can achieve the effect of reinforcing the suppression of deformation of film 10, while enabling the flow of resin during molding. As a result, breakage of leads 30 caused by deformation of film 10 can be prevented.

As described above, since semiconductor device 1000 of this embodiment is not only provided with the first group of aperture portions 14 in regions 500 to 800 in which leads are not formed but it is also provided with the second group of aperture portions 16 in lead formation regions 100 to 400, molten resin flows through these aperture portions 14 and 16 during the transfer molding, so that the molding resin can link the two sides of film 10 and peeling of the resultant resin sealing portion is prevented.

Further, since the second group of aperture portions 16 is divided into a plurality of aperture portions 16a to 16e to ensure the mechanical strength of film 10, deformation of film 10 caused by tensile forces acting during operations such as film transport is suppressed, and thus breakage of leads 30 caused by deformation of the film is prevented.

Figure 4:
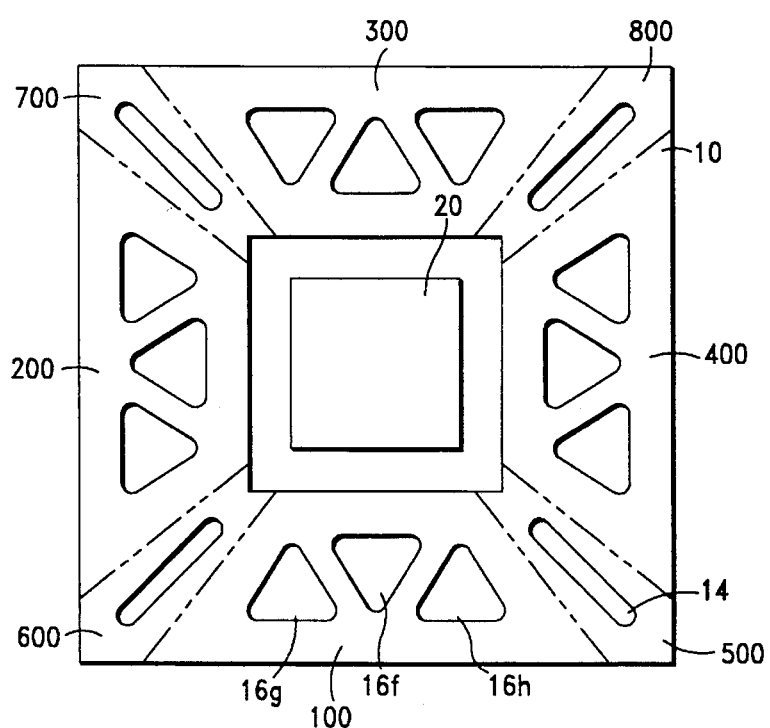
FIG. 4 is plan view showing a variation of the aperture portions of the first embodiment.

In this embodiment, the shapes and numbers of the first group of aperture portions 14 and second group of aperture portions 16 are not particularly limited, and they can take many forms within a range such that the molten resin can flow and the strength of film 10 can be ensured. For example, in a variation of the first and second groups of aperture portions 14 and 16 shown in FIG. 4, the configuration could be such that substantially triangular aperture portions 16f to 16h are arranged alternately in the vertical direction.

An example of the process used to manufacture this semiconductor device 1000 will now be described. Note that description of the configurations of film 10, lead groups 30A to 30D, and aperture portions 14 and 16 provided in the film 10 are omitted.

Figure 5:
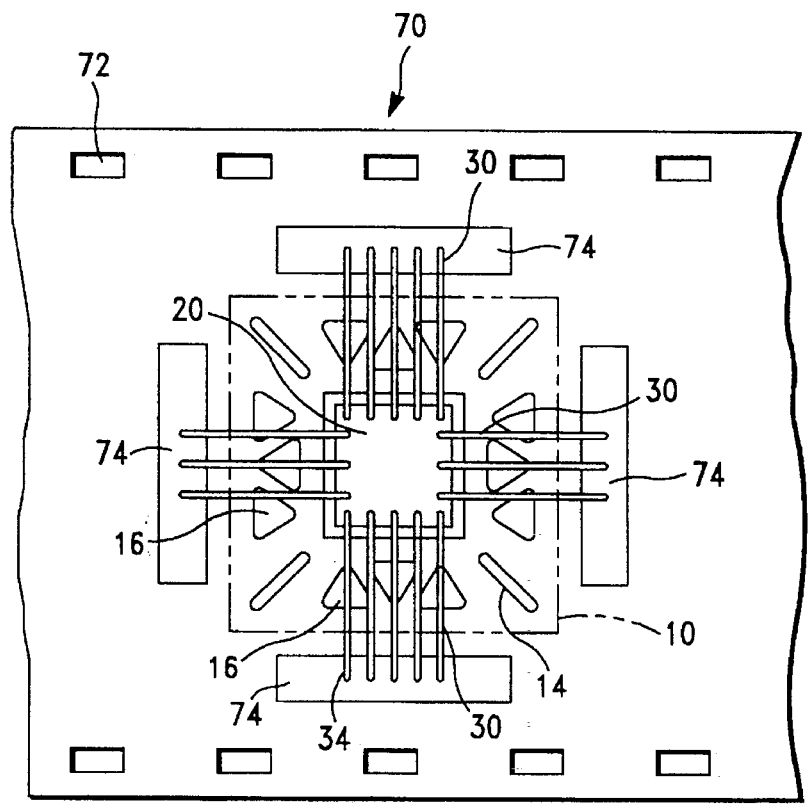
FIG. 5 is a plan view showing a sheet of film used to illustrate the manufacturing process of the semiconductor device of the first embodiment.

First, as shown in FIG. 5, device hole 12, sprocket holes 72, outer lead holes 74, first group of aperture portions 14, and second group of aperture portions 16 are formed on a long film carrier 70 (thickness: 75 to 125 μm) that is the base material, by being punched out by a die. Next, copper foil (usually of a thickness of 18 to 35 μm) is attached to film carrier 70 by an adhesive, and then photolithography techniques are used to paint a photoresist on both surfaces of the film, subject it to mask exposure and develop it, and finally etch it, to form lead groups 30A to 30D including leads 30 in a predetermined pattern. Leads 30 are usually plated with a material such as Sn, Au, or solder. The leads of this embodiment are processed by Ni-plating on a copper wire surface, then by Au-plating.

Next, IC chip 20 is arranged at a predetermined position within device hole 12, and electrodes 22 on the surface of IC chip 20 and inner lead portions 32 of leads 30 are connected and subjected to inner lead bonding (ILB) by the pressurization and heating (usually to 300° to 400° C.) using a heating tool.

Figure 6:
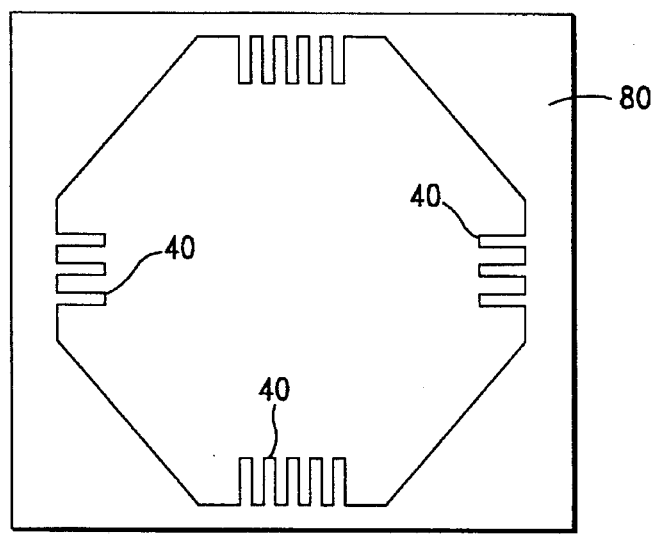
FIG. 6 is a plan view showing a lead frame used to illustrate the manufacturing process of the semiconductor device of the first embodiment.

A lead frame 80 on which outer leads 40 are formed (see FIG. 6) is prepared separately. This lead frame 80 is mounted onto film 70 and is positioned so that outer leads 40 are superimposed over the outer lead linkage portions 34 of leads 30. Outer lead linkage portions 34 and outer leads 40 are then connected in a batch by coupling means such as welding or soldering (outer bonding).

Subsequently, a region that includes IC chip 20, leads 30, and parts of outer leads 40 is sealed in resin by transfer molding, to form a resin sealing portion 50. Outer leads 40 are then plated with solder and are then cut off by a press to complete the manufacturing of the semiconductor device. Subsequently, outer leads 40 can be bent and shaped if necessary to facilitate their insertion into a printed circuit board or the like.

The above manufacturing process has the advantage that, since outer leads 40 are formed by using lead frame 80, the dimensions and strength of outer leads 40 can be set independently of those of the leads.

In the above described process, any one of the generally-used bump method, transfer bump method, or mesa bump method can be used as the coupling means between inner lead portions 32 and the electrodes (not shown in the figure) of IC chip 20, but it is preferable to use the mesa bump method. The mesa bump method uses a half-etching process to form bumps that are integral with the leads at the lead tips. A specific method of manufacturing mesa bumps is disclosed in, for example, Japanese Patent Application Laid Open No. Sho 55-162253. The mesa bump method has various advantages: for example, it does not require any special equipment for forming the bumps on the IC chip, it permits the use of aluminum-pad IC chips, it has a high yield but low mounting costs, and it also permits slim mounting packages.

Further, in the above described process, in order to increase the coupling force between IC chip 20 and resin that forms the resin sealing portion 50, it is preferable to form small irregularities on the under-surface of IC chip 20 by a method such as grinding or etching. In order to increase its adhesion with the resin that forms resin sealing portion 50, the surface of film 10 is preferably subjected to plasma processing in a vapor phase including, for example, inert gas (argon, helium, or the like), reactive gas (oxygen, $CF_4$, or the like), or reducing gas (hydrogen or the like).

In comparison with packages obtained by other mounting methods such as the wire bonding method, the package obtained by this TAB technique has various advantages in that it permits the mounting of thin packages at a high density, each step of bonding the inner leads and bonding the outer leads can be done in a single batch, electrical characteristics can be tested while the chip is still on the tape, and mounting yields are not deteriorated, even with multi-chip assemblies.

Second Embodiment

Figure 7:
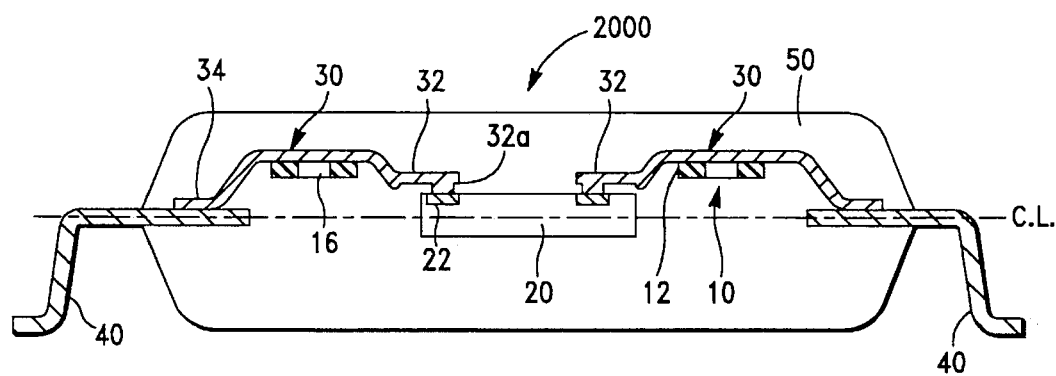
FIG. 7 is a vertical cross sectional view showing the semiconductor device of the second embodiment of this invention.
Figure 8:
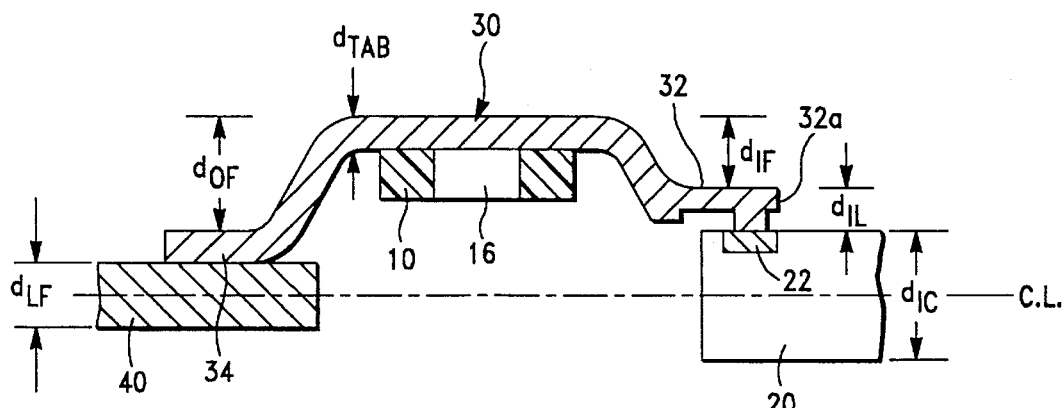
FIG. 8 is a partial enlarged cross sectional view of essential components of the semiconductor device of FIG. 7.

FIG. 7 is a cross sectional view showing a semiconductor device 2000 of a second embodiment of this invention, with a partial enlarged cross sectional view of essential components of semiconductor device 2000 being shown in FIG. 8.

Semiconductor device 2000 has the same basic structure as semiconductor device 1000, and therefore the substantially identical components are given the same reference numbers and the detailed description is omitted. Semiconductor device 2000 of this embodiment differs from semiconductor device 1000 in that IC chip 20 is positioned at substantially the center of semiconductor device 2000 in the depthwise direction.

In the above semiconductor device 1000 shown in FIG. 3, leads 30 extend straight outward from the surface of film 10, outer lead linkage portions 34 and outer leads 40 are joined together, and then the tips of inner lead portions 32 are connected to IC chip 20 with IC chip 20 suspended underneath them. Therefore, IC chip 20 is positioned below the center of resin sealing portion 50 in the depthwise direction.

In contrast, in semiconductor device 2000 of this embodiment, the center of IC chip 20 is positioned at the center line C.L. in the depthwise direction of resin sealing portion 50. To construct this configuration, inner lead portion 32 and outer lead linkage portion 34 of each of leads 30 are shaped. The amount of this forming (the depth of forming) is determined in such a manner that the following equation (see FIG. 8) is satisfied: Equation:

$$\tfrac{1}{2}(d_{LF}) + d_{TAB} + d_{OF} = d_{IF} + d_{IL} + \tfrac{1}{2}(d_{IC})$$

where:

$d_{LF}$: thickness of outer lead (lead frame)

$d_{TAB}$: thickness of lead $d_{OF}$: depth of forming of outer lead linkage portion $d_{IF}$: depth of forming of inner lead portion $d_{IL}$: thickness of inner lead portion $d_{IC}$: thickness of IC chip The depths of forming $d_{OF}$ and $d_{IF}$ in the above equation must be designed to suit the thicknesses of leads 30, outer leads 40, and IC chip 20. In the current state of the art, the thickness of the IC chip is greater than that of the other components, so the thickness of resin sealing portion 50 is actually dependent on the thickness of the IC chip. For example, if the thickness $d_{IC}$ of IC chip 20 is between 200 μm and 600 μm, the thickness $d_{TAB}$ of leads 30 is between 10 μm and 40 μm, the thickness $d_{LF}$ of outer leads 40 is between 100 μm and 300 μm, and the thickness $d_{IL}$ of inner lead portion 32 is between 5 μm and 30 μm, the depth of forming $d_{IF}$ of inner lead portion 32 is set to between 50 μm and 200 μm, and the depth of forming $d_{OF}$ of outer lead linkage portion 34 is set to between 85 μm and 720 μm. Here, the sign "31'" indicates forming in the opposite direction to that of FIG. 8. In such a semiconductor device, the thickness of resin sealing portion 50 is generally between 1 mm and 5 mm. In the future, as the thicknesses of IC chips decrease, this thickness could fall to the order of 100 μm to 200 μm. Such a thickness would be substantially the same as that of the outer leads, and the depths of forming of inner lead portion 32 could be made even smaller (they could be set within the range of between 0 μm and 50 μm, for example), so that the thickness of the resin sealing portion could be reduced even further to about between 200 μm and 1000 μm.

Positioning IC chip 20 at the center in the depthwise direction of resin sealing portion 50 in the manner of this embodiment ensures that the useful functions described below can be achieved.

Transfer molding is one of the sealing techniques that can be used for manufacturing this type of semiconductor device. A particularly important part of the transfer molding process is the balance between the volumes of the upper and lower cavities separated by the object to be sealed (the assembly of film carrier 70 and lead frame 80, with IC chip 20 mounted thereon (see FIG. 3)) that is inserted into the mold. With this type of molding, the molten resin is usually injected through a single gate, so that, if the volumes of the separate cavities are unbalanced, the cavity with the smaller volume will be filled first by the molten resin, then the molten resin will flow toward the cavity that is still not filled, and thus resin pressure will act vertically on the object to be sealed. The resultant tilting of the IC chip or deformation of the film could cause breaking or short-circuiting of the leads.

In semiconductor device 2000 of this embodiment, IC chip 20, which takes up the greatest volume, is positioned at substantially the center of the mold (at the boundary between the upper and lower dies), so that the volumes of the upper and lower cavities separated by the object to be sealed can be made substantially equal. As a result, since it is possible to suppress the above described excess pressure that would be applied to the object to be sealed by the flow of the molten resin in the vertical direction, deformation of the film or leads and displacement of the IC chip can be prevented. Note that, since it is difficult to accurately align the center line of the IC chip 20 at the center line of the resin sealing portion, a certain amount of error is permissible so that, for example, the center line of the resin sealing portion can be positioned anywhere in the depthwise direction within the thickness of the IC chip.

In this manner, in addition to the effects of the first embodiment, this embodiment has the advantage that deformation of the device caused by resin pressure during the transfer molding can be suppressed.

Figure 9:
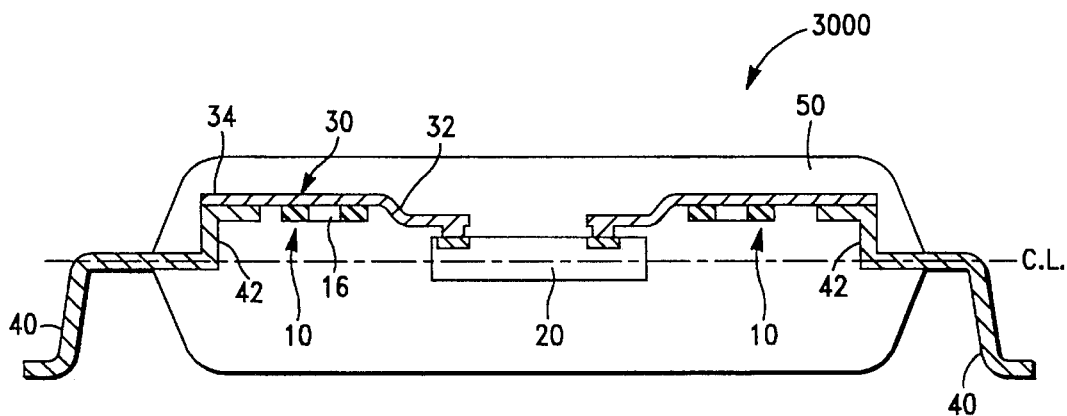
FIG. 9 is a vertical cross sectional view showing a variation on the second embodiment of this invention.

A cross sectional view showing a variation of this embodiment is in FIG. 9. A semiconductor device 3000 of this embodiment differs from that of the above described semiconductor device 2000 in that the tip portions of outer leads 40 are shaped instead of outer lead linkage portions 34 of leads 30. Joint ends 42 of these outer leads 40 are shaped when the lead frame is formed, and the depth of shaping replaces the depth of forming $d_{OF}$ of the above equation.

Third Embodiment

Figure 10:
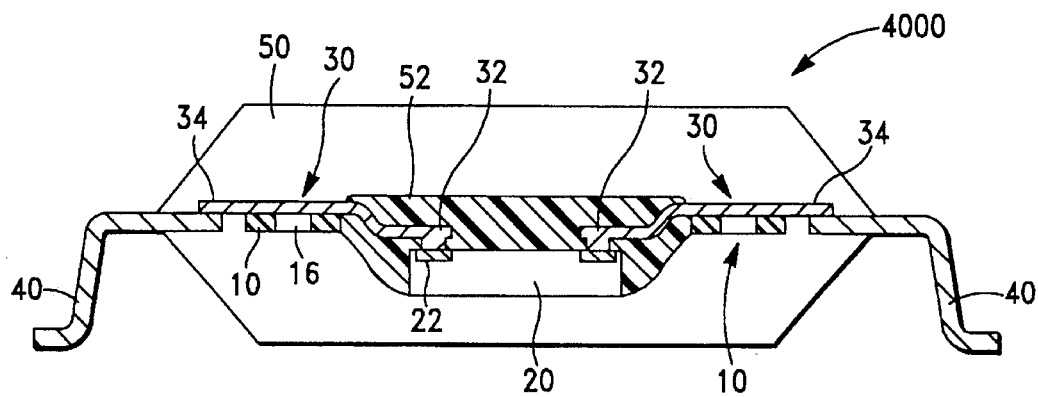
FIG. 10 is a vertical cross sectional view showing the semiconductor device of the third embodiment of this invention.

A cross sectional view showing a semiconductor device 4000 of a third embodiment of this invention is in FIG. 10. Since this semiconductor device 4000 has the same basic structure as the first embodiment, the substantially identical components are given the same reference numbers and the detailed description is omitted. This semiconductor device 4000 differs from the semiconductor device 1000 of the first embodiment in that a resin layer 52 of a resin that is different from that of resin sealing portion 50 is formed in a region that includes at least inner lead portions 32 of the leads and the IC chip 20.

Resin layer 52 is composed of a resin that has excellent adhesive properties with respect to the metal of inner lead portions 32, particularly the metal Au or Sn for example plated over their surfaces, and also the resin of the resin sealing portion 50. A rubber-denaturalized epoxy resin, a phenol resin, a polyimide resin, or a silicon resin can also be suitably used as this resin.

Since the epoxy resin that is often used for the resin sealing portion usually has poor adhesive properties with respect to the plated layer of the leads, heat, moisture, or mechanical shock could cause problems such as peeling or cracking between the leads and the resin sealing portion. Invasion of water or active ion through these peeled or cracked portions could cause corrosion of the aluminum electrodes of the IC chip. In particular, factors such as differences in coefficient of thermal expansion between the leads and the resin sealing portion could cause peeling or cracking to occur in portions with poor adhesive properties, due to heating during the step of the semiconductor device mounting.

In this embodiment, the provision of resin layer 52 ensures that, in addition to the effects of the first embodiment, the portions around electrodes 22 of IC chip 20 can be protected by a resin with good adhesive properties and with small stress, so that the occurrence of peeling or cracking can be prevented.

Before the formation of resin sealing portion 50 during the manufacturing of this semiconductor device 4000, resin layer 52 is formed in the predetermined region by a method that includes steps such as potting, painting, and injection molding, then resin sealing portion 50 is formed as usual by transfer molding.

In semiconductor device 4000 described above, a resin layer 52 is formed of a resin that has good adhesive properties with respect to both leads 30 and the resin of resin sealing portion 50, so that the occurrence of peeling or cracking of the sealing portion can be prevented. In particular, since electrodes 22 of IC chip 20 are completely sealed in by resin layer 52, their corrosion can be reliably prevented.

Figure 11:
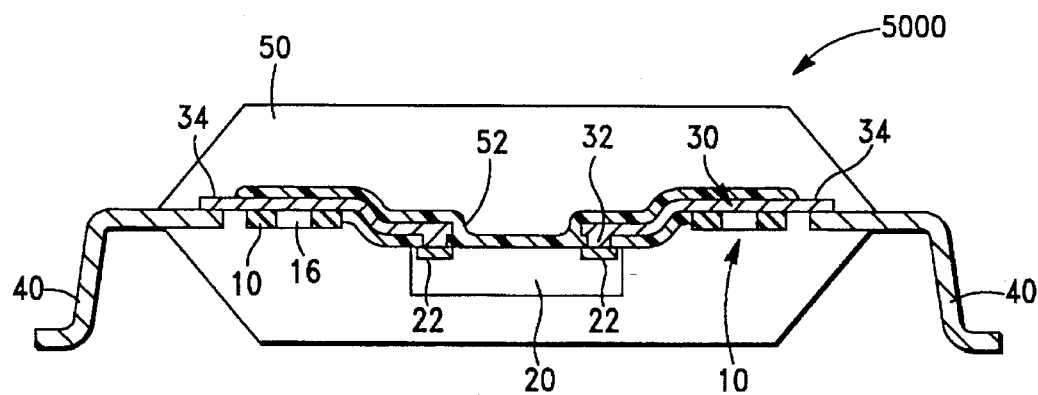
FIG. 11 is a vertical cross sectional view of a variation on the third embodiment of this invention.

A cross sectional view of a variation of this embodiment is shown in FIG. 11. A semiconductor device 5000 of this embodiment is basically the same as semiconductor device 4000, except that the region covered by resin layer 52 is larger. Resin layer 52 is formed to cover not only the area surrounding IC chip 20, but a wider region excluding only outer lead linkage portions 34 of leads 30. In this case, in considering the adhesive properties with the resin forming film 10 (such as polyimide resin), an epoxy type of polyimide resin, or silicon resin could preferably be used.

Fourth Embodiment

Figure 12:
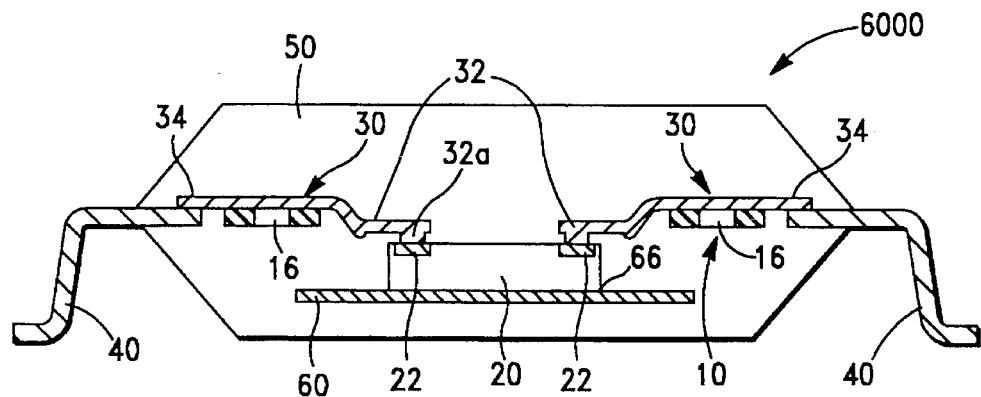
FIG. 12 is a vertical cross sectional view showing the fourth embodiment of this invention.

A cross sectional view showing a semiconductor device 6000 of a fourth embodiment of this invention is in FIG. 12. This semiconductor device 6000 is basically the same as semiconductor device 1000 of the first embodiment. Therefore, the substantially identical components are given the same reference numbers and the detailed description is omitted.

Figure 13:
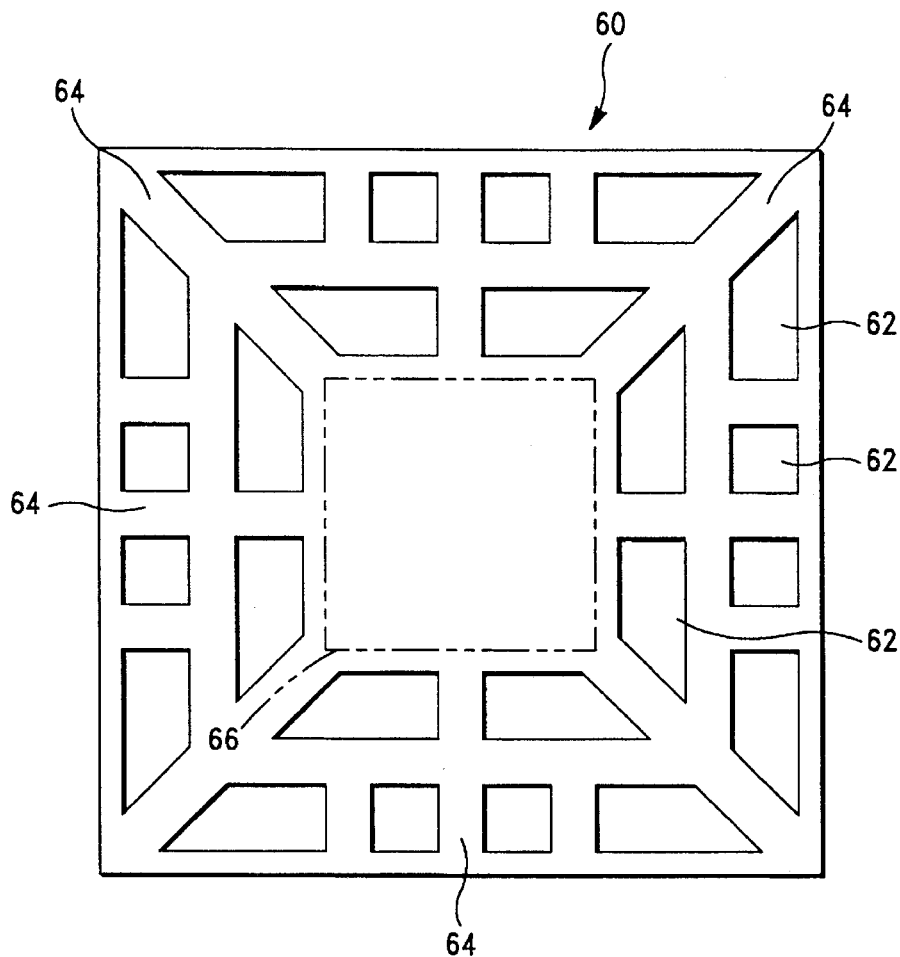
FIG. 13 is a plan view of the radiator portion shown in FIG. 12.

Semiconductor device 6000 of this embodiment differs from semiconductor device 1000 of the first embodiment in that a radiator portion 60 is provided on the lower surface of IC chip 20. This radiator portion 60 has a joint portion 66 for IC chip 20 at the center of its surface, as shown in FIG. 13, as well as a large number of aperture portions 62 that will allow the passage of molten resin during the transfer molding. Radiator portion 60 also preferably has radially extending linear linking portions 64 to ensure the mechanical strength of radiator portion 60. Further, indentations are preferably formed by grinding or by etching on the surface of radiator portion 60 (the surface opposite to that on which IC chip 20 is mounted), in order to increase the adhesive properties of resin sealing portion 50. To increase the heat-radiating effect of radiator portion 60, it is preferably made to have as high a thermal conductivity as possible, and is preferably made of a metal such as copper, aluminum, or of a ceramic such as BeO, SiC. The size of radiator portion 60 is not particularly limited but, in considering its heat radiation efficiency, it can be formed to be, for example, at least two times the size of IC chip 20.

In semiconductor device 6000 of this embodiment, the use of radiator portion 60 to facilitate the radiation of heat from IC chip 20 sealed in by resin sealing portion 50 having low thermal conductivity ensures that deterioration of the characteristics of the IC device due to heat can be suppressed.

Figure 14:
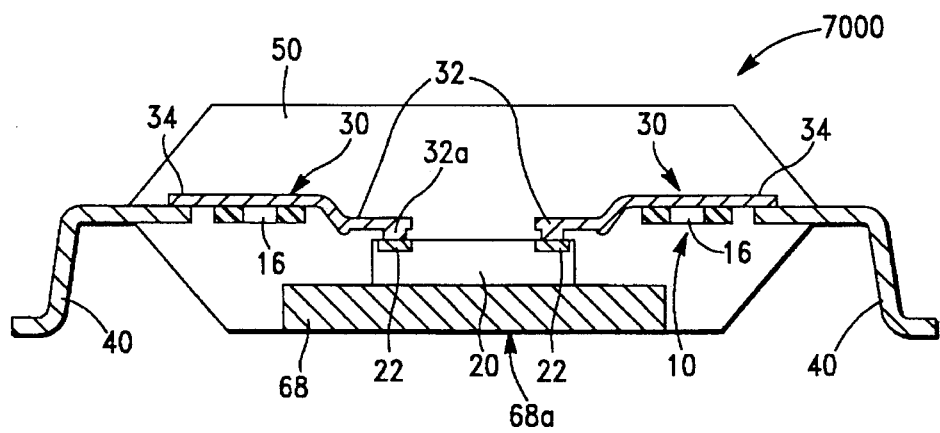
FIG. 14 is a vertical sectional view showing a modification of the fourth embodiment of the present invention.
Figure 15:
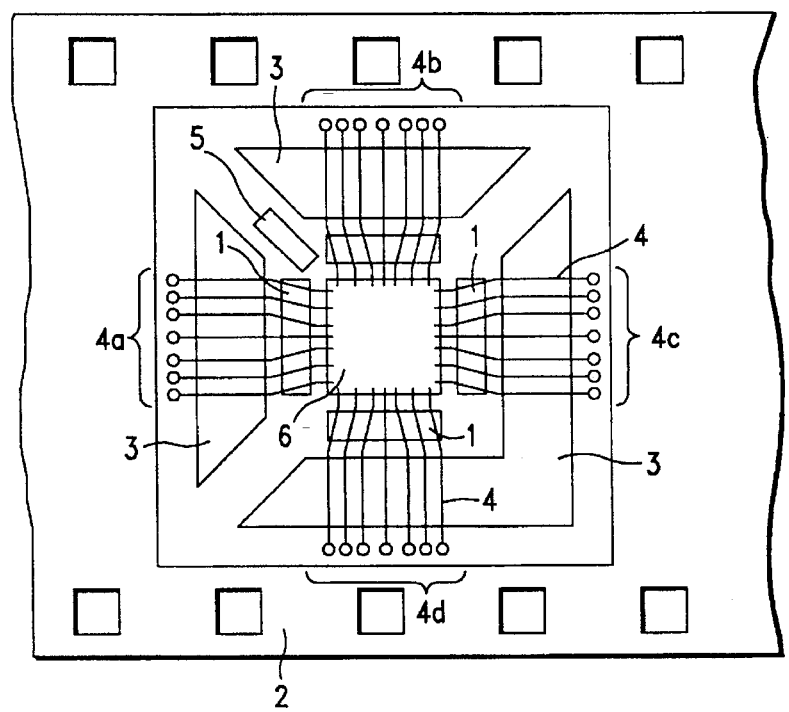
FIG. 15 is a partial plan view of an example of a prior art semiconductor device.
Figure 16:
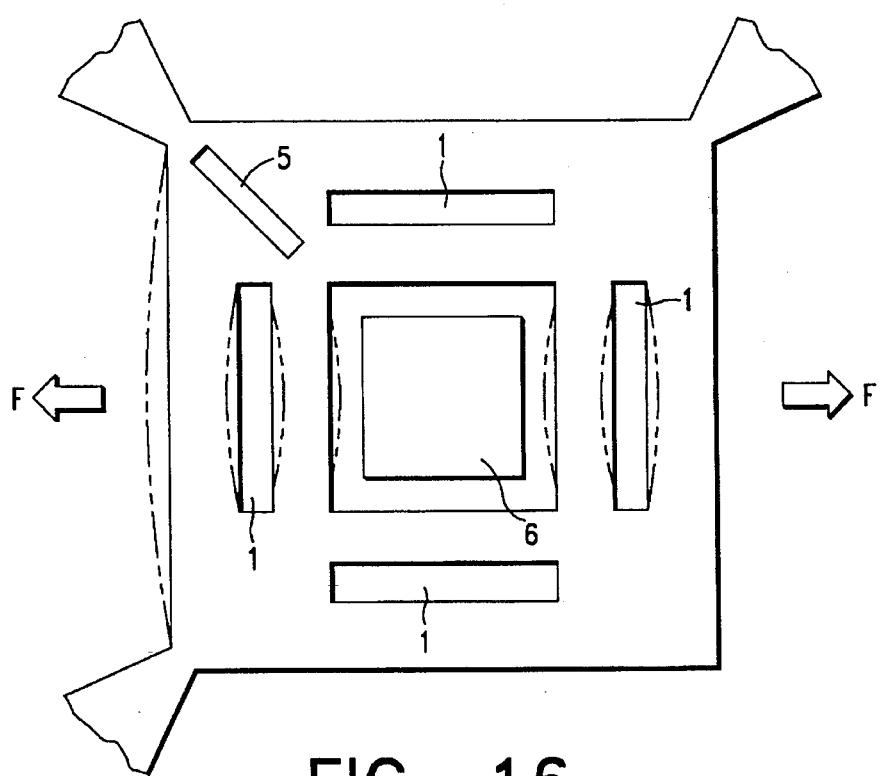
FIG. 16 is a view showing a state in which the film of the semiconductor device of FIG. 15 is deformed.

FIG. 14 is a vertical sectional view showing a modification of the present embodiment. In the semiconductor device 7000, radiator portion 68 is thicker than the above described radiator portion 60. One surface 68a of radiator portion 68 is arranged to be substantially in the same plane as one surface of resin sealing portion 50. Therefore, radiator portion 68 has a thickness corresponding to the distance between lower surface of IC chip 20 and the lower surface of resin sealing portion 50 in FIG. 14.

According to semiconductor device 7000 of such arrangement, the radiator portion 68 provides not only the effective heat-dissipation, but also the simpler processing. The simpler processing is brought about by the radiator portion functioning as a spacer during the transfer-molding thus making the precision positioning of IC chip 20 unnecessary.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device comprising:

an electrically insulating film having a device hole and a plurality of lead formation regions around said device hole;

a plurality of lead groups, each group including a large number of leads, arranged in a predetermined pattern that is formed in said plurality of lead formation regions on the surface of said film;

an integrated circuit chip arranged within said device hole of said film and having electrodes connected to ends of said leads; and a resin sealing portion that seals in at least said integrated circuit chip, said film, and said lead groups;

wherein said m comprises:

means, formed in said film, for securing bonding between said film and said resin sealing portion and for dispersing and absorbing external tensile forces acting on said film to suppress deformation of said film;

wherein said securing, dispersing and absorbing means includes a plurality of slit-shaped apertures, each slit-shaped aperture being provided in a region between two adjacent lead formation regions;

a plurality of groups of aperture portions, each group being provided in each of said lead formation region; and a plurality of linking portions formed on said film between adjacent aperture portions in each group of aperture portions, such that stresses generated by the external tensile forces are dispersed along said linking portions.

2. The semiconductor device according to claim 1, wherein:

each of said leads comprises an inner lead portion extending into said device hole and an outer lead linkage portion extending outward beyond said film, and said outer lead linkage portion is connected to an outer lead of a mechanical strength greater than that of said outer lead linkage portion.

3. The semiconductor device according to claim 1, wherein said linking portions are orientated such that their longitudinal directions intersect edges of said film at predetermined angles.

4. The semiconductor device according to claim 1, wherein:

said linking portions are orientated such that their longitudinal directions are perpendicular to said leads.

5. The semiconductor device according to claim 1, wherein:

said aperture portions of each group are arranged symmetrically in a lead formation region relative to the edges of said film.

6. The semiconductor device according to claim 1, wherein:

said aperture portions of each group are positioned away from bent portions of said leads.

7. The semiconductor device according to claim 1, wherein:

side leads positioned at the outermost sides of said leads are wider than the other leads.

8. The semiconductor device according to claim 1, wherein:

said integrated circuit chip is positioned at substantially the center in the depthwise direction of said resin sealing portion.

9. The semiconductor device according to claim 8, wherein:

the position of said integrated circuit chip is set by the depth of forming of an inner lead portion and an outer lead linkage portion of said leads.

10. The semiconductor device according to claim 8, wherein:

the position of said integrated circuit chip is set by the depth of forming of an inner lead portion and outer leads of said leads.

11. The semiconductor device according to claim 1, further comprising:

a resin layer having good adhesive properties with respect to said leads and said resin sealing portion, said resin layer being formed in a region encompassing inner lead portions of said leads and electrodes of said integrated circuit chip.

12. The semiconductor device according to claim 1, wherein each aperture portion has a longest edge with a length not greater than one half of the length of an edge of the device hole.

13. The semiconductor device according to claim 1, further comprising:

a radiator portion attached to said integrated circuit chip.

14. The semiconductor device according to claim 13, wherein said radiator portion includes a plurality of aperture portions.

15. The semiconductor device according to claim 13, wherein: said radiator portion is disposed in said resin sealing portion and has one surface substantially in the same plane as one surface of said resin sealing portion.

* * * * *

UNITED STATES PATENT AND TRADEMARK OFFICE
CERTIFICATE OF CORRECTION

PATENT NO.   : 5,554,885
DATED        : September 10, 1996
INVENTOR(S)  : Yasuo Yamasaki, et al.

It is certified that an error appears in the above identified patent and that said Letters Patent is hereby corrected as shown below: Title page:

Item 56, change "Kuraisji" to --Kuraishi--.

Column 11, Line 59, change "m" to --film--.

Column 12, Line 2, change "region" to --regions--.

Signed and Sealed this

Third Day of December, 1996

Attest:

BRUCE LEHMAN

*Attesting Officer*  *Commissioner of Patents and Trademarks*